US008612902B1

(12) United States Patent  (10) Patent No.: US 8,612,902 B1
Agarwal et al.  (45) Date of Patent: Dec. 17, 2013

(54) RETARGETING MULTIPLE PATTERNED INTEGRATED CIRCUIT DEVICE DESIGNS

(71) Applicant: International Business Machines Corporation, Armonk, NY (US)

(72) Inventors: Kanak B. Agarwal, Austin, TX (US); Shayak Banerjee, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/628,278

(22) Filed: Sep. 27, 2012

(51) Int. Cl.
*G06F 17/50* (2006.01)

(52) U.S. Cl.
USPC .......................................................... 716/54

(58) Field of Classification Search
USPC .......................................................... 716/54
See application file for complete search history.

(56) References Cited

U.S. PATENT DOCUMENTS

| 7,752,577 | B1 | 7/2010 | Gennari et al. |
| 8,174,522 | B2 | 5/2012 | Watanabe |
| 2008/0222587 | A1* | 9/2008 | Smayling et al. ............... 716/7 |
| 2008/0244504 | A1* | 10/2008 | Drapeau et al. ............... 716/20 |
| 2009/0217224 | A1* | 8/2009 | Wiaux et al. .................. 716/5 |
| 2011/0179393 | A1 | 7/2011 | Xue et al. |
| 2011/0202892 | A1 | 8/2011 | Lee et al. |
| 2011/0288671 | A1 | 11/2011 | Agarwal |
| 2012/0131528 | A1* | 5/2012 | Chen et al. .................. 716/112 |
| 2012/0137261 | A1 | 5/2012 | Ban et al. |

OTHER PUBLICATIONS

Liu, Yongxiang et al., "Fine Grain 3D Integration for Microarchitecture Design Through Cube Packing Exploration", IEEE 25th International Conference on Computer Design, Oct. 7-10, 2007, pp. 259-266.

Nain, Rajeev K. et al., "Fast Placement-Aware 3-D Floorplanning Using Vertical Constraints on Sequence Pairs", IEEE Transactions on Very Large Scale Integration (VLSI) Systems, v.19, n. 9, Sep. 2011, pp. 1667-1680.

* cited by examiner

*Primary Examiner* — Thuan Do
(74) *Attorney, Agent, or Firm* — Francis Lammes; Stephen J. Walder, Jr.; Eustus D. Nelson

(57) ABSTRACT

A mechanism is provided for performing retargeting in a multiple-pattern integrated circuit device design manufacturing process. For at least one element on at least one exposure of multiple-pattern integrated circuit device design after decomposition, a lithographic simulation analysis is performed for a width and first space combination to generate a two-dimensional width and first space representation of lithographic variation. The two-dimensional width and first space representation is combined with second space of the element to a nearest element on pre-decomposed layout of the multiple-pattern integrated circuit device design to generate a three-dimensional representation of retargeting bias values. Responsive to a determination that the element requires a retargeting bias, a retargeting bias is selected for the element based on the three-dimensional representation of retargeting bias values. The fabrication of the integrated circuit device design is then controlled based on the selected retargeting bias for the element.

19 Claims, 7 Drawing Sheets

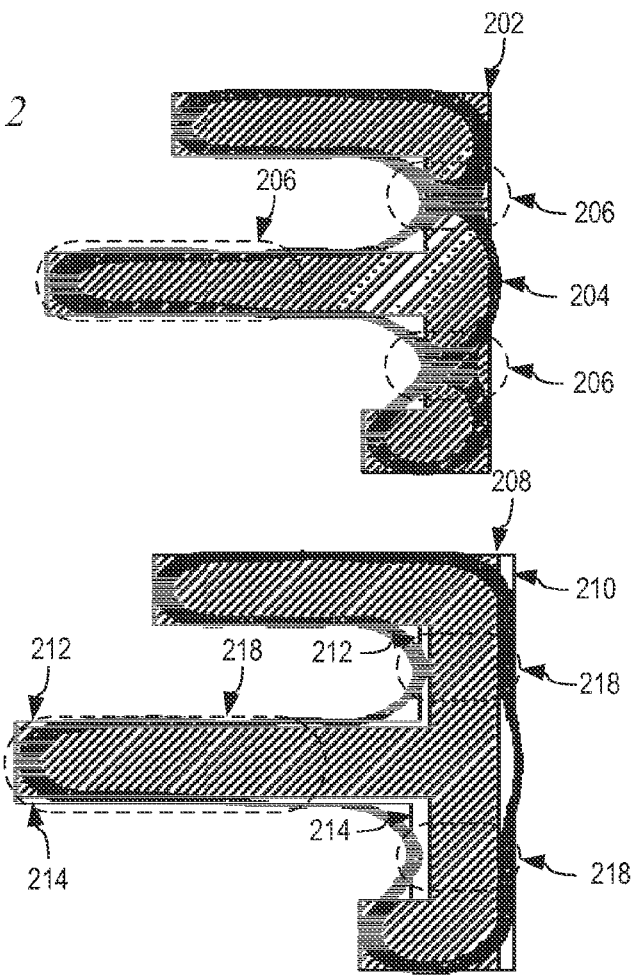
FIG. 2
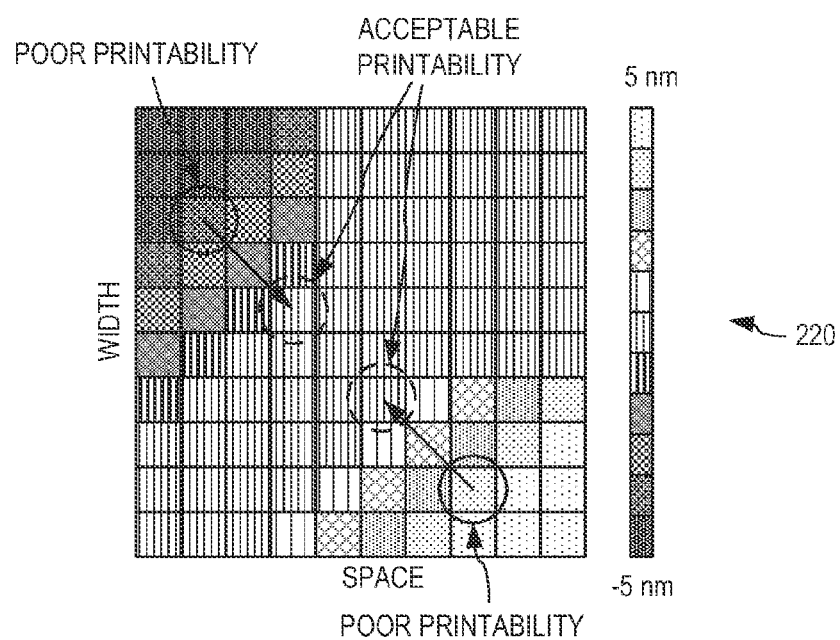

RETARGETING MULTIPLE PATTERNED INTEGRATED CIRCUIT DEVICE DESIGNS

BACKGROUND

The present application relates generally to an improved data processing apparatus and method and more specifically to mechanisms for retargeting multiple patterned integrated circuit device designs.

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

Multiple patterning is a class of technologies developed for photolithography to enhance the feature density. The simplest case of multiple patterning is double patterning, where a conventional lithography process is enhanced to use two patterning steps to print a set of features. Double patterning is a sequence of two separate patterning steps using two different photomasks to achieve wafer level frequency doubling. This technique is commonly used for patterns in the same layer which have incompatible densities or pitches than those resolvable by single patterning. In one important case, the two patterning steps may each consist of alternate lines with twice the spatial pitch or half of the spatial frequency of the original layouts. This allows the decomposition of dense patterns into two sparser patterns which are easier to print.

Double pattern lithography (DPL) is an effective technique to improve resolution. DPL theoretically doubles resolution through pitch splitting such that effective pitch of the layout for each patterning step is halved. DPL involves two separate exposures and etch/freeze steps (litho-etch-litho-etch or litho-freeze-litho-etch). DPL is expected to be needed for 20 nm technology and is one of the best candidate solutions for scaling to 14 nm technology and beyond.

For one-dimensional patterns at minimum pitch, layout decomposition for double patterning is trivial. Decomposition is very complex for more complicated two-dimensional patterns. DPL layout decomposition solutions typically cast layout decomposition as a graph coloring problem where two features less than a certain minimum spacing must be assigned different colors. DPL decomposition is very challenging to implement at the full-chip level when stitch insertion is considered. A stitch insertion in a polygon during decomposition indicates that one part of the polygon will be printed in the first patterning step while the remaining part of the polygon will be printed using second patterning, with the two parts joining together at the stitch location. Stitches can help in removing some decomposition conflicts but they can potentially break a polygon into multiple pieces. Conflicts that cannot be removed with stitch insertion require layout modification (sometimes major), which can be very challenging and costly (increase layout area). As a result, considering all candidate stitch insertion locations during layout decomposition is crucial to take full advantage of stitching capability.

SUMMARY

In one illustrative embodiment, a method, in a data processing system, is provided for performing retargeting in a multiple-pattern integrated circuit device design manufacturing process. The illustrative embodiment performs, for at least one element on at least one exposure of multiple-pattern integrated circuit device design after decomposition, a lithography simulation analysis for a width and first space combination to generate a two-dimensional width and first space representation of lithographic variation. In the illustrative embodiment the first space values are to a nearest element on a same exposure of the decomposed multiple-pattern integrated circuit device design. The illustrative embodiment combines the two-dimensional width and first space representation of lithographic variation with second space of the element to a nearest element on pre-decomposed layout of the multiple-pattern integrated circuit device design to build a three-dimensional representation of retargeting bias values. The illustrative embodiment selects a retargeting bias for the element based on the three-dimensional representation of retargeting bias values in response to a determination that the element requires a retargeting bias. The illustrative embodiment controls fabrication of the integrated circuit device design based on the selected retargeting bias for the element.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 2 is an example block diagram of a computing device in which aspects of the illustrative embodiments may be implemented;

DETAILED DESCRIPTION

Common lithographic processing of a layout for an integrated circuit device design manufacturing process may be improved by local perturbation of target patterns in some instances. The perturbation of the target layout for the integrated circuit device design manufacturing process is known as retargeting. Retargeting modifies the target layout shapes as opposed to optical proximity correction (OPC) which optimizes mask shapes for a given target. However, when retargeting is applied to a multiple patterning process, printability, and/or reliability issues may occur. Therefore, in order to address retargeting issues in the multiple patterning process, the illustrative embodiment provides a multiple patterning retargeting mechanism for retargeting rule generation and application-considering pre-decomposition and post-decomposition constraints that include impact of overlay in multiple patterning processes. Thus, the multiple patterning retargeting mechanism is aware of existing structures not only on a current exposure for lithographic optimality, but also in an original target in order to prevent wafer defects.

Figure 1:
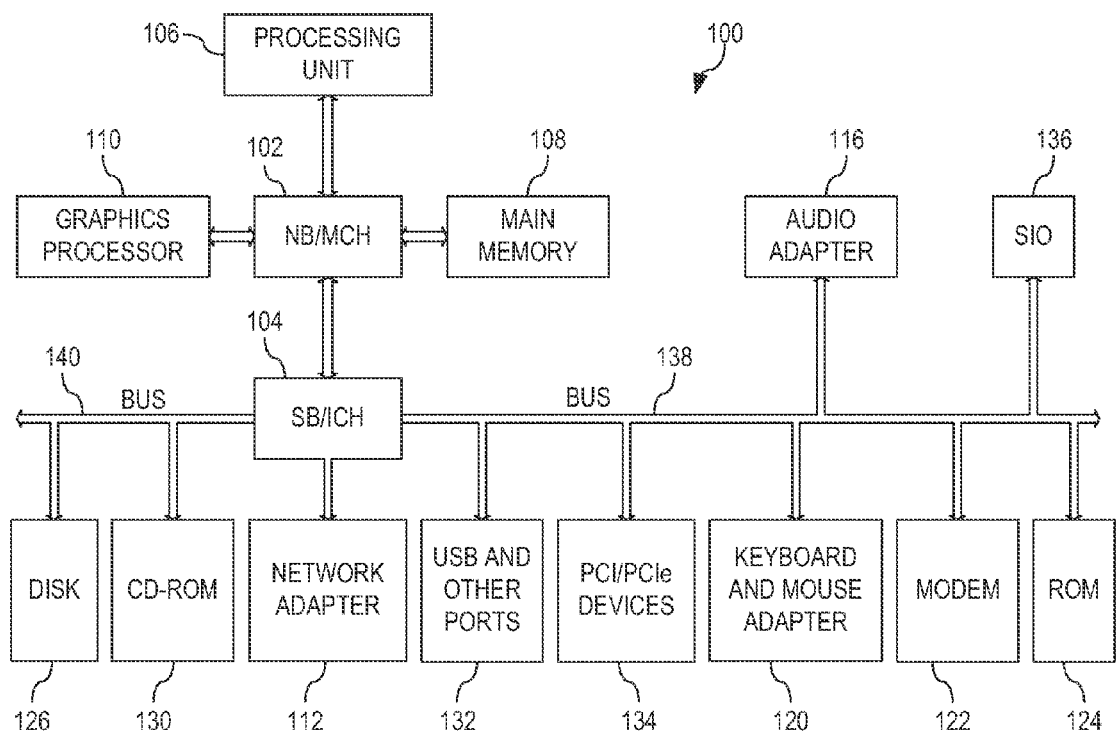
FIG. 1 is an example diagram of a distributed data processing system in which aspects of the illustrative embodiments may be implemented.

Thus, the illustrative embodiments may be utilized in many different types of data processing environments. In order to provide a context for the description of the specific elements and functionality of the illustrative embodiments, FIG. 1 is provided hereafter as an example environment in which aspects of the illustrative embodiments may be implemented. It should be appreciated that FIG. 1 is only an example and is not intended to assert or imply any limitation with regard to the environments in which aspects or embodiments of the present invention may be implemented. Many modifications to the depicted environments may be made without departing from the spirit and scope of the present invention.

FIG. 1 is a block diagram of an example data processing system in which aspects of the illustrative embodiments may be implemented. Data processing system 100 is an example of a computer in which computer usable code or instructions implementing the processes for illustrative embodiments of the present invention may be located.

In the depicted example, data processing system 100 employs a hub architecture including north bridge and memory controller hub (NB/MCH) 102 and south bridge and input/output (I/O) controller hub (SB/ICH) 104. Processing unit 106, main memory 108, and graphics processor 110 are connected to NB/MCH 102. Graphics processor 110 may be connected to NB/MCH 102 through an accelerated graphics port (AGP).

In the depicted example, local area network (LAN) adapter 112 connects to SB/ICH 104. Audio adapter 116, keyboard and mouse adapter 120, modem 122, read only memory (ROM) 124, hard disk drive (HDD) 126, CD-ROM drive 130, universal serial bus (USB) ports and other communication ports 132, and PCI/PCIe devices 134 connect to SB/ICH 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash basic input/output system (BIOS).

HDD 126 and CD-ROM drive 130 connect to SB/ICH 104 through bus 140. HDD 126 and CD-ROM drive 130 may use, for example, an integrated drive electronics (IDE) or serial advanced technology attachment (SATA) interface. Super I/O (SIO) device 136 may be connected to SB/ICH 104.

An operating system runs on processing unit 106. The operating system coordinates and provides control of various components within the data processing system 100 in FIG. 1. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 100.

As a server, data processing system 100 may be, for example, an IBM® eServer™ System p® computer system, running the Advanced Interactive Executive (AIX®) operating system or the LINUX® operating system. Data processing system 100 may be a symmetric multiprocessor (SMP) system including a plurality of processors in processing unit 106. Alternatively, a single processor system may be employed.

Instructions for the operating system, the object-oriented programming system, and applications or programs are located on storage devices, such as HDD 126, and may be loaded into main memory 108 for execution by processing unit 106. The processes for illustrative embodiments of the present invention may be performed by processing unit 106 using computer usable program code, which may be located in a memory such as, for example, main memory 108, ROM 124, or in one or more peripheral devices 126 and 130, for example.

A bus system, such as bus 138 or bus 140 as shown in FIG. 1, may be comprised of one or more buses. Of course, the bus system may be implemented using any type of communication fabric or architecture that provides for a transfer of data between different components or devices attached to the fabric or architecture. A communication unit, such as modem 122 or network adapter 112 of FIG. 1, may include one or more devices used to transmit and receive data. A memory may be, for example, main memory 108, ROM 124, or a cache such as found in NB/MCH 102 in FIG. 1.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device that is configured with flash memory to provide non-volatile memory for storing operating system files and/or user-generated data, for example. Essentially, data processing system 100 may be any known or later developed data processing system without architectural limitation.

Retargeting may be applied either by using a set of pre-characterized rules or by a model-based process which relies on real time lithographic simulations to determine retarget values. A typical rule-based retargeting flow modifies target layout shapes for an integrated circuit device design manufacturing process by exhaustively simulating various width and space combinations for wires using existing lithographic models. The retargeting bias values for each width and space combination are stored in a look-up table and these pre-characterized look-up tables are used during retargeting to modify target shapes with very low runtime overhead. The model-based retargeting, on the other hand, determines retargeting values from lithographic simulations performed during the retargeting process. FIG. 2 depicts an example of retargeting performed by a model-based retargeting mechanism. The model-based retargeting mechanism may start with target shape 202. After optical proximity correction, the printability is assessed through optical rule checking. If process variability bands (PV-bands) produced by lithographic contours 204 indicate errors that comprise area of pinching 206, the retargeting performed by the retargeting module then biases target shape 208 by adding shapes 210, 212, and 214 to areas 218 where pinching was previously identified that will compensate for the errors identified during optical rule checking.

In a rule-based retargeting flow, the retargeting module may obtain the retargeting bias values for a particular width and space combination by moving the width and space combination with poor printability to a nearest width and space combination with acceptable printability using a search algorithm. The search procedure results in a pre-generated two-dimensional retargeting bias table 220, which is applied to layouts during data preparation for fast correction. As is illustrated in two-dimensional retargeting bias table 220 when a particular width and particular space with poor printability is identified, the edge of the target is moved diagonally until an acceptable printability width and space combination is identified.

Figure 3:
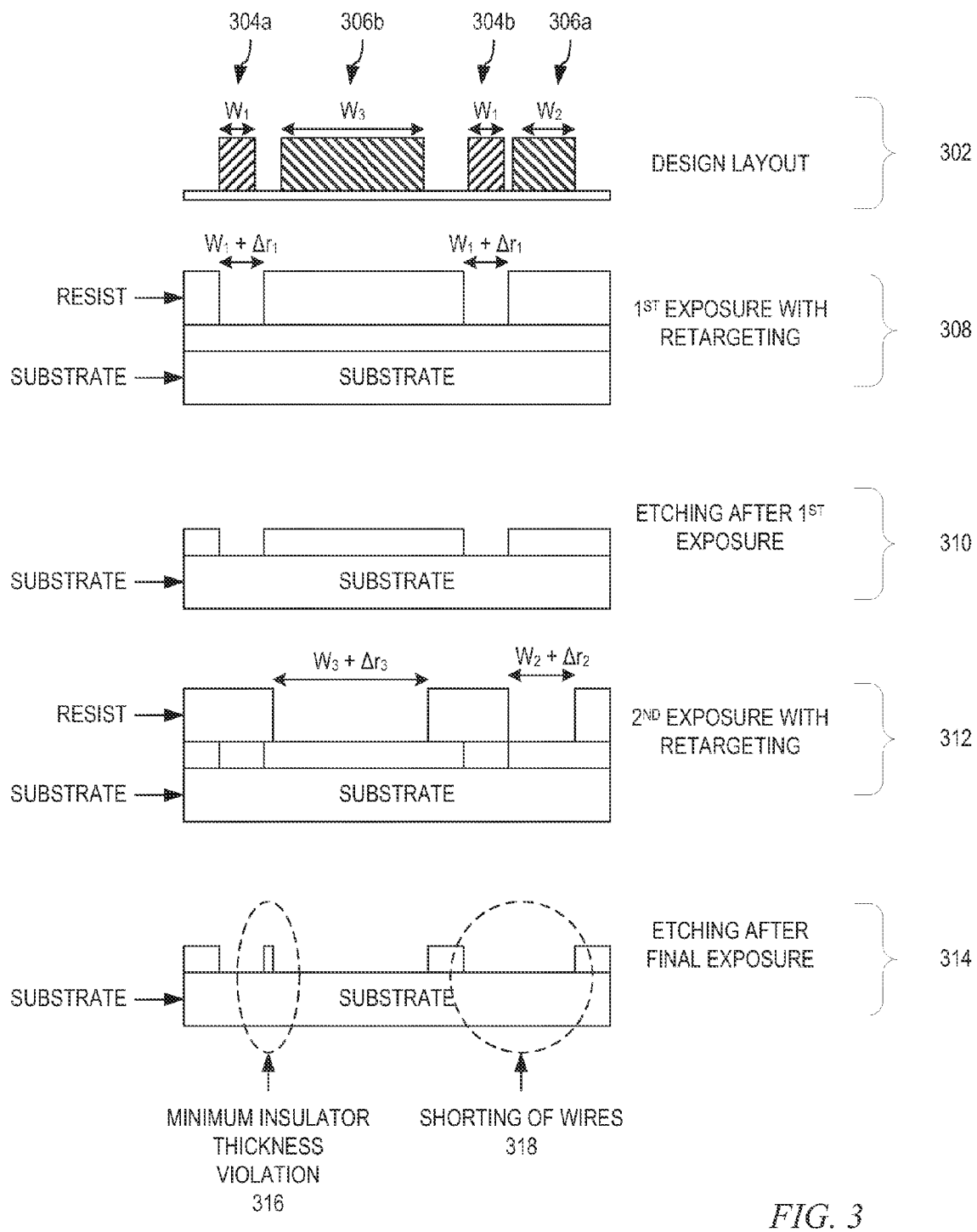
FIG. 3 depicts an exemplary multiple patterning process that utilizes a current retargeting process in accordance with an illustrative embodiment.

However, applying conventional retargeting to multiple-patterning requires retargeting being applied to a single exposure at a time. Yet, if retargeting is unaware of the other exposure and the two exposures interact at etch time, reliability issues may occur such as minimum insulator thickness violations, overlay errors, potential shorting, or the like. FIG. 3 depicts an exemplary multiple patterning process that utilizes a current retargeting process in accordance with an illustrative embodiment. Section 302 illustrates the design layout for a multiple pattern with sections 304a and 304b each of width $W_1$ that will be printed in a first exposure and sections 306a and 306b of width $W_2$ and $W_3$, respectively, that will be printed in a second exposure. Section 308 depicts the first exposure with retargeting, such that the widths $W_1$ are widened by some retargeting value $\Delta r_1$. Thus, after the first exposure, the etching is as shown in section 310. In section 312, the second exposure with retargeting is performed, such that the width $W_2$ is widened by some retargeting value $\Delta r_2$ and the width W3 is widened by some retargeting value $\Delta r_3$. Thus, after the second exposure, the final etching is shown in section 314. As is shown in section 314, since the retargeting $\Delta r_1$ in the first exposure is not aware of mask overlay and the retargeting $\Delta r_2$ and $\Delta r_3$ performed in the second exposure and since the retargeting $\Delta r_2$ and $\Delta r_3$ performed in the second exposure is not aware of mask overlay and the retargeting $\Delta r_1$ in the first exposure, minimum insulator thickness violation 316 and shorting of wires 318 may occur as a result of the interactions between the first exposure and the second exposure in the final etching.

Figure 4:
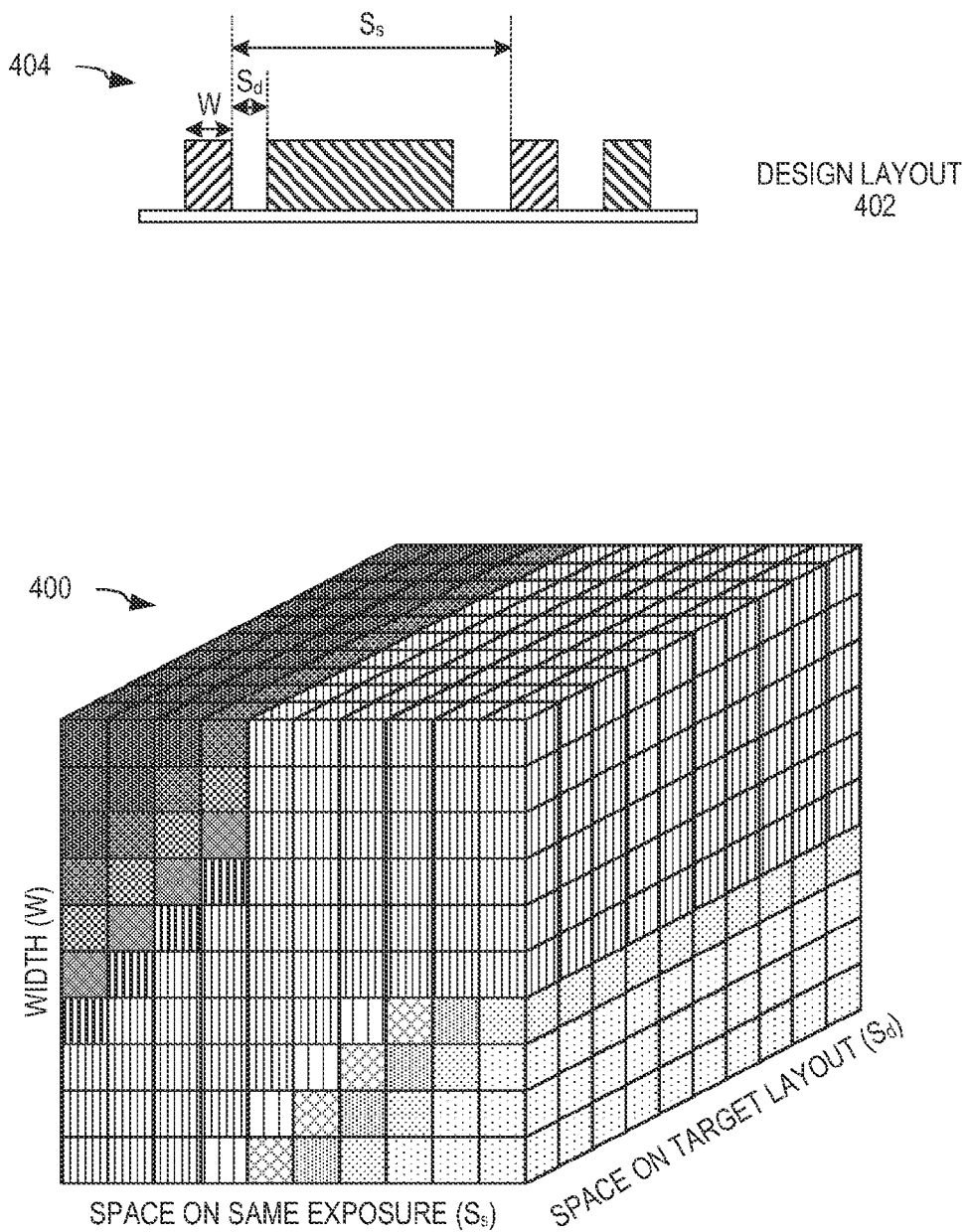
FIG. 4 illustrates obtaining retargeting biases Δr based on process variability (PV) band optimization and the generation of a three-dimensional retargeting bias table for different combinations of width (W), space to nearest feature on the same exposure ($S_s$), and space to nearest feature in original target ($S_d$) in accordance with an illustrative embodiment.

In order to address retargeting issues in the multiple patterning process for a multiple-pattern integrated circuit device design, the illustrative embodiment provides a multiple patterning retargeting mechanism for retargeting rule generation and application-considering pre-decomposition and post-decomposition constraints that include impact of overlay in multiple patterning processes. In order to generate retargeting rules for multiple patterning, the multiple patterning retargeting mechanism performs a lithographic simulation analysis for all possible combinations of single exposure width and space configurations in order to generate a dependent two-dimensional variability data table of lithographic variation. However, the multiple patterning retargeting mechanism combines the two-dimensional variability data with multiple-patterning constraints and pre-decomposition ground rules for allowed spacings. Therefore, the multiple patterning retargeting mechanism obtains retargeting biases $\Delta r$ based on process variability (PV) band optimization subject to pre-decomposition feature spacing and mask overlay constraints. The retargeting mechanism generates three-dimensional retargeting bias table 400 for different combinations of width (W), space to nearest feature on the same exposure ($S_s$), and space to nearest feature in original target ($S_d$), as is illustrated in FIG. 4 in accordance with an illustrative embodiment. The original target refers to the original pre-decomposed multiple-pattern integrated circuit device design. In FIG. 4, for an exemplary design layout 402, the multiple patterning retargeting mechanism identifies a retargeting bias for each edge of design layout 402 based on the width (W) of the element, the distance or space from the edge to the closest edge of a nearest feature or element on a same exposure ($S_s$), and the distance or space of the edge to the closest edge of a nearest feature or element in original target ($S_d$) as is illustrated in diagram 404.

The multiple patterning retargeting mechanism generates three-dimensional retargeting bias table 400 by identifying the process variability bands (PV-bands) through lithographic simulation depending on width and post-decomposition spacing such that PV (W+$\Delta r$, $S_s$–$\Delta r$), where PV is a two-dimensional lithographic process variation function, where W is the width of the element, $\Delta r$ is the retargeting bias, and $S_s$ is the space to nearest feature on the same exposure. Further, the multiple patterning retargeting mechanism utilizes an optimization constraint set by pre-decomposition target spacing and mask overlay such that $S_d - \Delta d_{Overlay} - \Delta r - r_{max} \geq S_{mm}$ and such that $\Delta r \leq r_{max}$, where $S_d$ is space to nearest feature in original target, $\Delta d_{Overlay}$ is the worst-case overlay between masks, $\Delta r$ is the retargeting bias value that needs to be calculated by the optimization, $r_{max}$ is the maximum retargeting bias that can be applied to any edge, and $S_{min}$ is the minimum post-etch distance between elements such that printability and/or reliability issues should not occur. Thus, the multiple patterning retargeting mechanism utilizes constrained optimization and/or constrained search to find best retargeting bias for each cell in three-dimensional retargeting bias table 400 utilizing additional constraints due to overlay and presence of features on other exposures.

That is, for a received design layout, the multiple patterning retargeting mechanism measures the width (W) of the element and the space ($S_d$) to the nearest element in the design layout, nearest edge to nearest edge. The multiple patterning retargeting mechanism then decomposes the design layout and, for each edge in the decomposed layout, measures the space ($S_s$) to the nearest element, nearest edge to nearest edge. The multiple patterning retargeting mechanism then tags each edge in the design layout with width (W), space to nearest feature on the same exposure ($S_s$), and space to nearest feature in the original target ($S_d$). Once the multiple patterning retargeting mechanism obtains the W, $S_s$, and $S_d$ for a current edge of a current element, the multiple patterning retargeting mechanism utilizes three-dimensional retargeting bias table 400 to identify whether the current W, $S_s$, and $S_d$ combination for the current edge has poor printability and, if so, identify a retargeting bias Δr to apply to the current edge of the current element. The multiple patterning retargeting mechanism then biases the current edge of the current element in the target shape by inserting or adding the retargeting bias to current edge of the current element. The multiple patterning retargeting mechanism performs the same process for all edges in the current exposure. Once all the edges in the current exposure have been analyzed, the multiple patterning retargeting mechanism performs optical proximity correction on the target patterns to produce OPC mask shapes for the current exposure. The multiple patterning retargeting mechanism repeats the process for all other exposures of the design layout.

Figure 5:
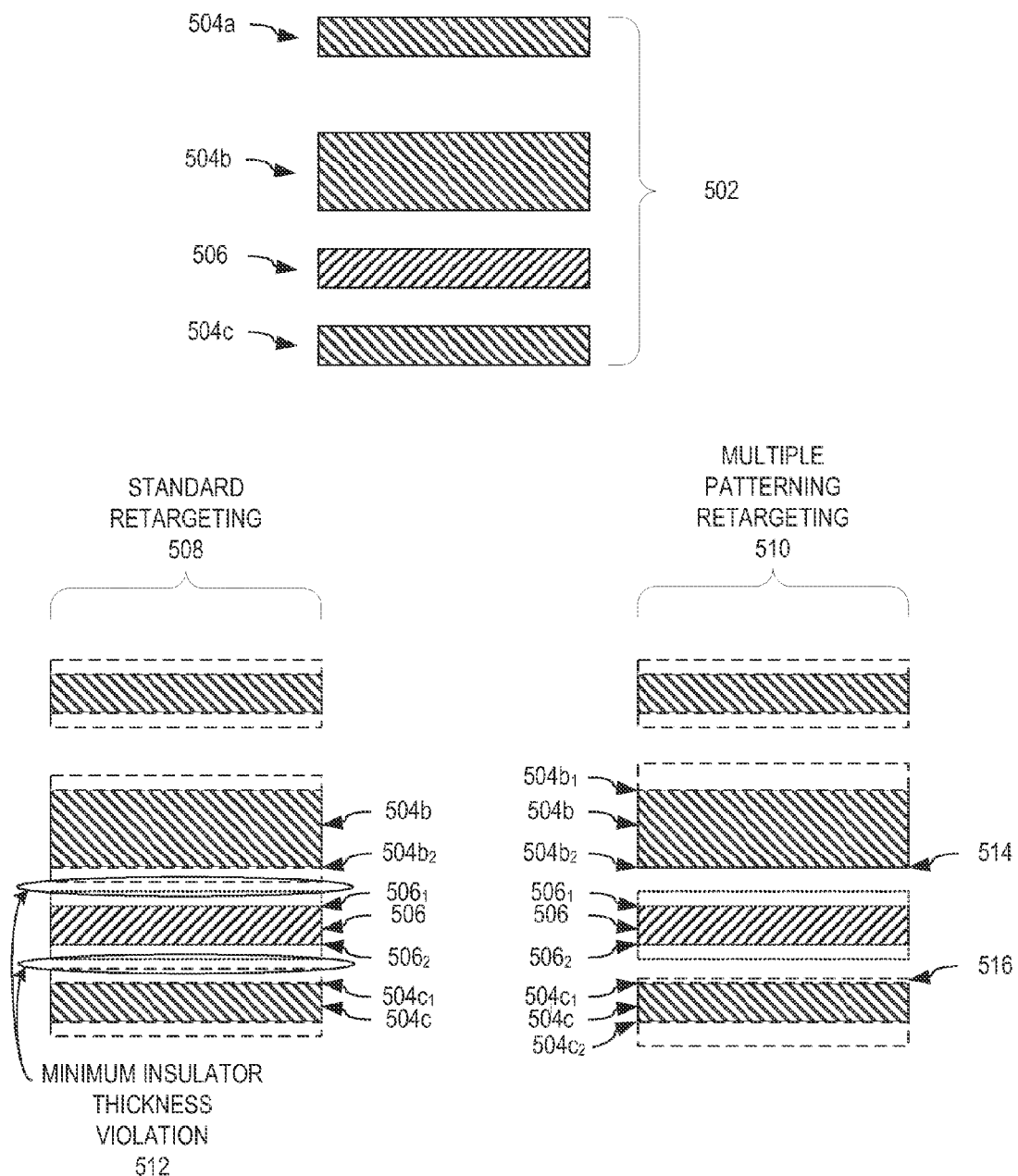
FIG. 5 depicts an example of the operation performed by a multiple patterning retargeting mechanism in contrast to the currently known operation in accordance with an illustrative embodiment.

FIG. 5 depicts an example of the operation performed by a multiple patterning retargeting mechanism in contrast to the currently known operation in accordance with an illustrative embodiment. In FIG. 5, design layout 502 is received and decomposed into elements 504a, 504b, and 504c, which will be patterned in a first exposure, and element 506, which will be patterned in a second exposure due to elements 506 proximity to elements 504b and 504c.

As is shown in standard retargeting 508, when the standard retargeting mechanism determines retargeting biases for elements 504a, 504b, and 504c which are added to the edges of elements 504a, 504b, and 504c without knowledge of element 506 or any retargeting biases that have or will be added to element 506. Then the standard retargeting mechanism determines retargeting biases for element 506 without knowledge of elements 504a, 504b, and 504c or any retargeting biases that have or will be added to elements 504a, 504b, and 504c. Therefore, the retargeting bias added to edge $504b_2$ of element 504b and the retargeting bias added to edge $506_1$ of element 506 cause minimum insulator thickness violation 512 to occur. Similarly, the retargeting bias added to edge $504c_1$ of element 504c and the retargeting bias added to edge $506_2$ of element 506 cause minimum insulator thickness violation 512 to occur.

In accordance with the illustrative embodiments, in multiple patterning retargeting 510, when the multiple patterning retargeting mechanism determines retargeting biases for elements 504a, 504b, and 504c, the multiple patterning retargeting mechanism is aware of element 506. Similarly, when the multiple patterning retargeting mechanism determines retargeting biases for element 506, the multiple patterning retargeting mechanism is aware of element 504a, 504b, and 504c. Therefore, the multiple patterning retargeting mechanism adds retargeting biases similar to that in standard retargeting to edge $506_1$ and edge $506_2$ of element 506 and, because of these retargeting biases, the multiple patterning retargeting mechanism adds, for example, no retargeting bias 514 to edge $504b_2$ of element 504b while compensating for the addition of no retargeting bias 514 to edge $504b_2$ by adding more retargeting bias, if necessary, to edge $504b_1$ of element 504b. Additionally, the multiple patterning retargeting mechanism adds, for example, little retargeting bias 516 to edge $504c_1$ of element 504c while compensating for the addition of little retargeting bias 516 to edge $504c_1$ by adding more retargeting bias, if necessary, to edge $504c_2$ of element 504c. The multiple patterning retargeting mechanism also considers the impact of mask overlay between elements 504a, 504b, and 504c printed using a first exposure and element 506 printed using a second exposure.

Therefore, by the multiple patterning retargeting mechanism applying retargeting rules that utilize pre-decomposition and post-decomposition constraints that include impact of overlay in multiple patterning processes, the multiple patterning retargeting mechanism applies retargeting biases without causing printability or reliability issues.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 6:
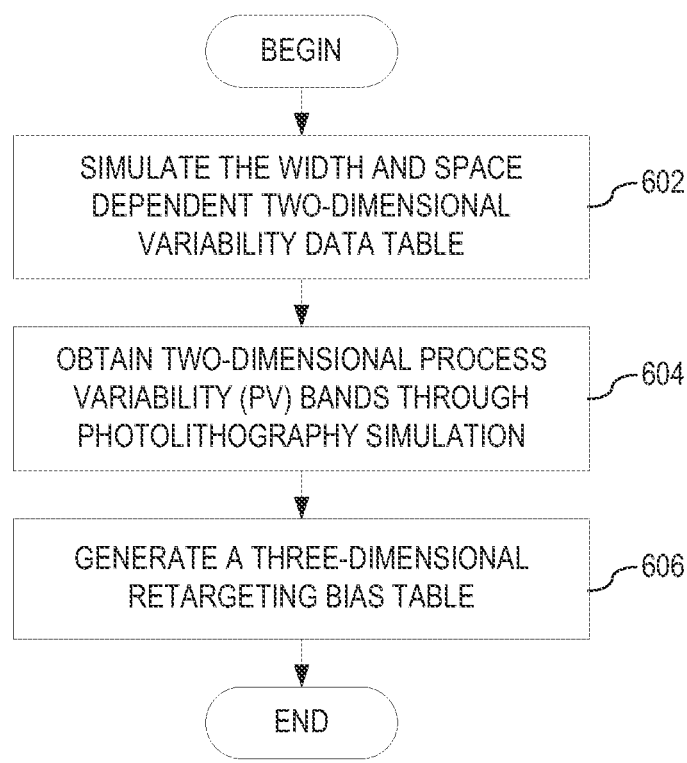
FIG. 6 depicts the operation performed in generating a three-dimensional multiple patterned retargeting bias look-up table in accordance with an illustrative embodiment.

FIG. 6 depicts the operation performed in generating a three-dimensional multiple patterned retargeting bias look-up table in accordance with an illustrative embodiment. It should be noted that this operation generally occurs outside and offline of analyzing the multiple-pattern integrated circuit device design and the actual mask generation. That is, the three-dimensional multiple patterned retargeting bias look-up table may be generated at any time prior to a mask being generated in order to reduce the delay that may occur in generating a three-dimensional multiple patterned retargeting bias look-up table.

As the operation begins, the multiple patterning retargeting mechanism utilizes technology ground rules for single exposure to simulate the width and space dependent two-dimensional variability data table considering single-exposure with different width (W) and a different space to nearest feature on a same exposure ($S_s$) configurations (step 602). The multiple patterning retargeting mechanism then obtains two-dimensional process variability (PV) bands through photolithography simulation (step 604).

The multiple patterning retargeting mechanism utilizes the technology ground rules for multi-patterned design to combine the two-dimensional process variability (PV) data of steps 602 and 604, the pre-decomposition pattern spacing permitted by the technology ground rules multi-patterned design, and any predefined multiple patterning overlay constraints to generate a three-dimensional retargeting bias table for different combinations of width (W), space to nearest feature on a same exposure ($S_s$), and space to nearest feature in original target ($S_d$) (step 606), with the operation ending thereafter. Again, each retargeting bias in the three-dimensional retargeting bias table is constrained by width and post-decomposition spacing such that PV (W+$\Delta r$, $S_s$−$\Delta r$), where W is the width of the element, $\Delta r$ is the retargeting bias, and $S_s$ is the space to nearest feature on the same exposure as well as an optimization constraint set by pre-decomposition target spacing and mask overly such that $S_d$−$\Delta d_{Overlay}$−$\Delta r$−$r_{max}$≥$S_{min}$ and such that $\Delta r$≤$r_{max}$, where $S_d$ is the space to nearest feature in original target, $\Delta d_{Overlay}$ is the worst-case mask overlay, $\Delta r$ is the retargeting bias, $r_{max}$ is the maximum retargeting bias, and $S_{min}$ is the minimum post-etch distance between elements such that printability and/or reliability issues should not occur.

Figure 7:
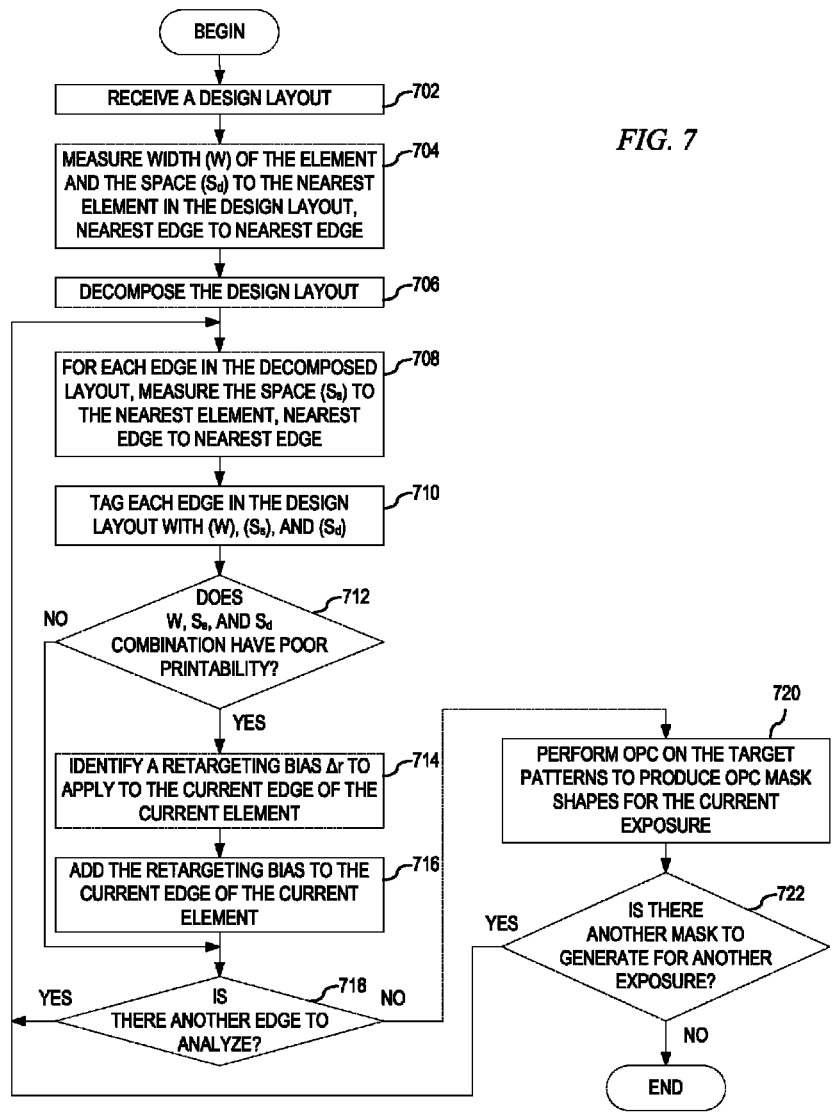
FIG. 7 depicts the operation performed in generating masks for manufacturing a multiple patterned design layout in accordance with an illustrative embodiment.

FIG. 7 depicts the operation performed in generating masks for manufacturing a multiple patterned design layout in accordance with an illustrative embodiment. As the operation begins, the multiple patterning retargeting mechanism receives a design layout (step 702). The multiple patterning retargeting mechanism measures the width (W) of the element and the space ($S_d$) to the nearest element in the design layout, nearest edge to nearest edge (step 704). The multiple patterning retargeting mechanism then decomposes the design layout (step 706) and, for each edge in the decomposed layout, measures the space ($S_s$) to the nearest element, nearest edge to nearest edge (step 708). The multiple patterning retargeting mechanism then tags each edge in the design layout with width (W), space to nearest feature on the same exposure ($S_s$), and space to nearest feature in the original target ($S_d$) (step 710). Once the multiple patterning retargeting mechanism obtains the W, $S_s$, and $S_d$ for a current element, the multiple patterning retargeting mechanism utilizes the three-dimensional retargeting bias table to identify whether the current W, $S_s$, and $S_d$ combination has poor printability (step 712).

If at step 712 the current W, $S_s$, and $S_d$ combination has poor printability, the multiple patterning retargeting mechanism identifies a retargeting bias $\Delta r$ to apply to the current edge of the current element (step 714) and inserts or adds the retargeting bias to the current edge of the current element (step 716). If at step 712 the current W, $S_s$, and $S_d$ combination has an acceptable printability or from step 716, the multiple patterning retargeting mechanism determines whether there is another edge to be analyzed (step 718). If at step 718 there is another edge, then the operation returns to step 708. If at step 718 there are no further edges, then the multiple patterning retargeting mechanism performs optical proximity correction on the target patterns to produce OPC mask shapes for the current exposure (step 720). The multiple patterning retargeting mechanism then determines whether there is another mask to generate for another exposure of the design layout (step 722). If at step 722 there is another mask for another exposure of the design layout to generate, then the operation returns to step 708. If at step 722 there is no other mask to generate, the operation terminates.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide mechanisms for multiple patterning retargeting mechanism for retargeting rule generation and application-considering pre-decomposition and post-decomposition constraints that includes impact of overlay in multiple patterning processes in order to address retargeting issues in the multiple patterning processes. Thus, the multiple patterning retargeting mechanism is aware of existing structures not only on a current exposure for lithographic optimality, but also in an original target in order to prevent wafer defects.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for performing retargeting in a multiple-pattern integrated circuit device design manufacturing process, comprising:
    performing, by a processor, for at least one element on at least one exposure of multiple-pattern integrated circuit device design after decomposition, a lithographic simulation analysis for a width and first space combination to generate a two-dimensional width and first space representation of lithographic variation, wherein the first space values are to a nearest element on a same exposure of the decomposed multiple-pattern integrated circuit device design;
    combining, by a processor, the two-dimensional width and first space representation of lithographic variation with second space of the element to a nearest element on pre-decomposed layout of the multiple-pattern integrated circuit device design to generate a three-dimensional representation of retargeting bias values, wherein the three-dimensional representation of retargeting bias values comprises a three-dimensional table of retargeting bias values for different combinations of width, first space to a nearest feature on a same exposure of the multiple-pattern integrated circuit device design when decomposed, and second space to a nearest feature in the pre-decomposed layout of multiple-pattern integrated circuit device design;
    responsive to a determination that the element requires a retargeting bias, selecting, by a processor, a retargeting bias for the element based on the three-dimensional representation of retargeting bias values; and
    controlling, by a processor, fabrication of the integrated circuit device design based on the selected retargeting bias for the element.

2. The method of claim 1, wherein the two-dimensional width and first space representation of lithographic variation to nearest element on the same exposure is for a single exposure of at least two exposures of the multiple-pattern integrated circuit device design, wherein the least two exposures comprise different sets of elements.

3. The method of claim 1, wherein the two-dimensional width and first space representation of lithographic variation is generated utilizing width and spacing combinations allowed by technology ground rules for single exposure.

4. The method of claim 1, wherein the three-dimensional representation of retargeting bias values is generated utilizing width and spacing combinations allowed by the technology ground rules for single exposure, pre-decomposition pattern spacings permitted by the technology ground rules for multi-patterned design, and predefined multiple patterning overlay constraints.

5. The method of claim 4, wherein the three-dimensional representation of retargeting bias values are generated by an optimization such that $PV(W+\Delta r, S_s-\Delta r)$ for a given W and $S_s$ are reduced, where PV is a two-dimensional lithographic process variation function, W is the width of the element, $\Delta r$ is a retargeting bias, and $S_s$ is the space to nearest feature on the same exposure.

6. The method of claim 4, wherein the pre-decomposition pattern spacings permitted by the technology ground rules for multi-patterned design and the predefined multiple patterning overlay constraints comprise an optimization constraint such that $S_d-\Delta d_{Overlay}-\Delta r-r_{max} \geq S_{min}$ and such that $\Delta r \leq r_{max}$, where $S_d$ is the space to nearest feature in original target, $\Delta d_{Overlay}$ is a worst-case mask overlay, $\Delta r$ is a retargeting bias, $r_{max}$ is a maximum retargeting bias, and $S_{min}$ is a minimum post-etch distance between elements such that printability and/or reliability issues are avoided.

7. The method of claim 1, wherein the steps of performing and combining are performed offline for combinations of a plurality of width values, a plurality of first space values, and a plurality of second space values for various multiple-pattern integrated circuit device designs prior to analyzing the multiple-pattern integrated circuit device design.

8. A computer program product comprising a non-transitory computer readable storage medium having a computer readable program stored therein, wherein the computer readable program, when executed on a computing device, causes the computing device to:
    perform, for at least one element on at least one exposure of multiple-pattern integrated circuit device design after decomposition, a lithographic simulation analysis for a width and first space combination to generate a two-dimensional width and first space representation of lithographic variation, wherein the first space values are to a nearest element on a same exposure of the decomposed multiple-pattern integrated circuit device design;

combine the two-dimensional width and first space representation of lithographic variation with second space of the element to a nearest element on pre-decomposed layout of the multiple-pattern integrated circuit device design to generate a three-dimensional representation of retargeting bias values, wherein the three-dimensional representation of retargeting bias values comprises a three-dimensional table of retargeting bias values for different combinations of width, first space to a nearest feature on a same exposure of the multiple-pattern integrated circuit device design when decomposed, and second space to a nearest feature in the pre-decomposed layout of multiple-pattern integrated circuit device design;

responsive to a determination that the element requires a retargeting bias, select a retargeting bias for the element based on the three-dimensional representation of retargeting bias values; and control fabrication of the integrated circuit device design based on the selected retargeting bias for the element.

9. The computer program product of claim 8, wherein the two-dimensional width and first space representation of lithographic variation to nearest element on the same exposure is for a single exposure of at least two exposures of the multiple-pattern integrated circuit device design, wherein the least two exposures comprise different sets of elements.

10. The computer program product of claim 8, wherein the two-dimensional width and first space representation of lithographic variation is generated utilizing width and spacing combinations allowed by technology ground rules for single exposure.

11. The computer program product of claim 8, wherein the three-dimensional representation of retargeting bias values is generated utilizing width and spacing combinations allowed by the technology ground rules for single exposure, pre-decomposition pattern spacings permitted by the technology ground rules for multi-patterned design, and predefined multiple patterning overlay constraints.

12. The computer program product of claim 11, wherein the three-dimensional representation of retargeting bias values are generated by an optimization such that PV (W+$\Delta$r, $S_s$-$\Delta$r) for a given W and $S_s$ are reduced, where PV is a two-dimensional lithographic process variation function, W is the width of the element, $\Delta$r is a retargeting bias, and $S_s$ is the space to nearest feature on the same exposure.

13. The computer program product of claim 11, wherein the pre-decomposition pattern spacings permitted by the technology ground rules for multi-patterned design and the predefined multiple patterning overlay constraints comprise an optimization constraint such that $S_d$-$\Delta d_{Overlay}$-$\Delta$r-$r_{max}$≥$S_{min}$ and such that $\Delta$r≤$r_{max}$, where $S_d$ is the space to nearest feature in original target, $\Delta d_{Overlay}$ is a worst-case mask overlay, $\Delta$r is a retargeting bias, $r_{max}$ is a maximum retargeting bias, and $S_{min}$ is a minimum post-etch distance between elements such that printability and/or reliability issues are avoided.

14. An apparatus, comprising:
a processor; and
a memory coupled to the processor, wherein the memory comprises instructions which, when executed by the processor, cause the processor to:
perform, for at least one element on at least one exposure of multiple-pattern integrated circuit device design after decomposition, a lithographic simulation analysis for a width and first space combination to generate a two-dimensional width and first space representation of lithographic variation, wherein the first space values are to a nearest element on a same exposure of the decomposed multiple-pattern integrated circuit device design;

combine the two-dimensional width and first space representation of lithographic variation with second space of the element to a nearest element on pre-decomposed layout of the multiple-pattern integrated circuit device design to generate a three-dimensional representation of retargeting bias values, wherein the three-dimensional representation of retargeting bias values comprises a three-dimensional table of retargeting bias values for different combinations of width, first space to a nearest feature on a same exposure of the multiple-pattern integrated circuit device design when decomposed, and second space to a nearest feature in the pre-decomposed layout of multiple-pattern integrated circuit device design;

responsive to a determination that the element requires a retargeting bias, select a retargeting bias for the element based on the three-dimensional representation of retargeting bias values; and control fabrication of the integrated circuit device design based on the selected retargeting bias for the element.

15. The apparatus of claim 14, wherein the two-dimensional width and first space representation of lithographic variation to nearest element on the same exposure is for a single exposure of at least two exposures of the multiple-pattern integrated circuit device design, wherein the least two exposures comprise different sets of elements.

16. The apparatus of claim 14, wherein the two-dimensional width and first space representation of lithographic variation is generated utilizing width and spacing combinations allowed by technology ground rules for single exposure.

17. The apparatus of claim 14, wherein the three-dimensional representation of retargeting bias values is generated utilizing width and spacing combinations allowed by the technology ground rules for single exposure, pre-decomposition pattern spacings permitted by the technology ground rules for multi-patterned design, and predefined multiple patterning overlay constraints.

18. The apparatus of claim 17, wherein the three-dimensional representation of retargeting bias values are generated by an optimization such that PV (W+$\Delta$r, $S_s$-$\Delta$r) for a given W and $S_s$ are reduced, where PV is a two-dimensional lithographic process variation function, W is the width of the element, $\Delta$r is a retargeting bias, and $S_s$ is the space to nearest feature on the same exposure.

19. The apparatus of claim 17, wherein the pre-decomposition pattern spacings permitted by the technology ground rules for multi-patterned design and the predefined multiple patterning overlay constraints comprise an optimization constraint such that $S_d$-$\Delta d_{Overlay}$-$\Delta$r-$r_{max}$≥$S_{min}$ and such that $\Delta$r≤$r_{max}$, where $S_d$ is the space to nearest feature in original target, $\Delta d_{Overlay}$ is a worst-case mask overlay, $\Delta$r is a retargeting bias, $r_{max}$ is a maximum retargeting bias, and $S_{min}$ is a minimum post-etch distance between elements such that printability and/or reliability issues are avoided.

* * * * *